(12) United States Patent
Camillo-Castillo et al.

(10) Patent No.: US 7,791,105 B2
(45) Date of Patent: Sep. 7, 2010

(54) DEVICE STRUCTURES FOR A HIGH VOLTAGE JUNCTION FIELD EFFECT TRANSISTOR MANUFACTURED USING A HYBRID ORIENTATION TECHNOLOGY WAFER AND DESIGN STRUCTURES FOR A HIGH VOLTAGE INTEGRATED CIRCUIT

(75) Inventors: Renata Camillo-Castillo, Essex Junction, VT (US); Robert J. Gauthier, Jr., Hinesburg, VT (US); Richard A. Phelps, Colchester, VT (US); Andreas D. Stricker, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 223 days.

(21) Appl. No.: 12/121,286

(22) Filed: May 15, 2008

(65) Prior Publication Data
US 2009/0256174 A1 Oct. 15, 2009

Related U.S. Application Data

(63) Continuation of application No. 12/099,991, filed on Apr. 9, 2008, now abandoned.

(51) Int. Cl.
*H01L 29/778* (2006.01)
(52) U.S. Cl. .................. 257/190; 257/347; 257/351; 257/E29.246; 438/455; 438/481
(58) Field of Classification Search .............. 257/190, 257/347, 351, 353, 401, 532, E29.246; 438/455, 438/481
See application file for complete search history.

(56) References Cited

U.S. PATENT DOCUMENTS 4,700,461 A * 10/1987 Choi et al. ............... 438/149

| 6,020,227 | A | 2/2000 | Bulucea |
| 6,078,082 | A | 6/2000 | Bulucea |
| 6,576,966 | B1 | 6/2003 | Bulucea |
| 6,746,893 | B1 | 6/2004 | Forbes et al. |

(Continued)

OTHER PUBLICATIONS

Sugita, et al., "A Solid-State Variable Resistor Using a Junction FET", IEE Transactions on Parts, Hybrids, and Packaging, vol. PHP-12, No. 3, Sep. 1976, pp. 260-264.

(Continued)

*Primary Examiner*—Thinh T Nguyen
(74) *Attorney, Agent, or Firm*—Wood, Herron & Evans, LLP

(57) ABSTRACT

Device structures for a high voltage junction field effect transistor and design structures for a high voltage integrated circuit. The device structure is manufactured using a hybrid orientation technology wafer with a first semiconductor layer with a first crystalline orientation, a second semiconductor layer with a second crystalline orientation, and an insulating layer between the first and second semiconductor layers. The device structure includes an epitaxial semiconductor region having the second crystalline orientation and first and second p-n junctions in the epitaxial semiconductor region. The epitaxial semiconductor region extends from the second semiconductor layer through the insulating layer and the first semiconductor layer toward a top surface of the first semiconductor layer. The first and second p-n junctions are arranged in depth within the epitaxial semiconductor region between the second semiconductor layer and the top surface of the first semiconductor layer.

11 Claims, 4 Drawing Sheets

U.S. PATENT DOCUMENTS

| | | |
|---|---|---|
| 6,762,068 B1 | 7/2004 | Forbes et al. |
| 6,781,876 B2 | 8/2004 | Forbes et al. |
| 6,794,255 B1 | 9/2004 | Forbes et al. |
| 6,835,638 B1 | 12/2004 | Forbes et al. |
| 6,936,849 B1 | 8/2005 | Forbes et al. |
| 6,965,123 B1 | 11/2005 | Forbes et al. |
| 7,005,344 B2 | 2/2006 | Forbes et al. |
| 7,109,548 B2 | 9/2006 | Forbes et al. |
| 7,141,824 B2 | 11/2006 | Forbes et al. |
| 7,154,153 B1 | 12/2006 | Forbes et al. |
| 7,169,666 B2 | 1/2007 | Forbes et al. |
| 7,196,929 B1 | 3/2007 | Forbes et al. |
| 7,205,173 B2 | 4/2007 | Brunson et al. |
| 7,242,049 B2 | 7/2007 | Forbes et al. |
| 2006/0273400 A1 | 12/2006 | Arai et al. |

OTHER PUBLICATIONS

US 6,950,338, 09/2005, Forbes et al. (withdrawn)

* cited by examiner

DEVICE STRUCTURES FOR A HIGH VOLTAGE JUNCTION FIELD EFFECT TRANSISTOR MANUFACTURED USING A HYBRID ORIENTATION TECHNOLOGY WAFER AND DESIGN STRUCTURES FOR A HIGH VOLTAGE INTEGRATED CIRCUIT

CROSS-REFERENCE TO RELATED APPLICATIONS

This application is a continuation of application Ser. No. 12/099,991, filed Apr. 9, 2008, the disclosure of which is incorporated by reference herein in its entirety.

FIELD OF THE INVENTION

The invention relates generally to semiconductor device fabrication and, in particular, device structures for a junction field effect transistor fabricated using a hybrid orientation technology wafer and design structures for forming high voltage integrated circuits.

BACKGROUND OF THE INVENTION

High voltage and high power integrated circuits in semiconductor-on-insulator (SOI) technologies often use a junction field effect transistor (JFET) in series with a conventional metal-oxide-semiconductor field effect transistor (MOSFET) as a replacement for a complex lateral double-diffused metal oxide semiconductor (LDMOS) transistor. This approach is simple, yet effective, and avoids costly technology additions to a complementary metal-oxide-semiconductor (CMOS) process flow.

CMOS circuits have been traditionally fabricated on silicon wafers having a single crystal orientation, ordinarily a (100) crystal orientation. Electrons have a higher mobility in silicon characterized by a (100) crystal orientation in comparison with silicon of a (110) crystal orientation. In contrast, holes have higher mobility in silicon characterized by a (110) crystal orientation in comparison with silicon of a (100) crystal orientation.

In recognition of the dependence of carrier mobility upon crystal orientation in single crystal silicon, hybrid orientation technology (HOT) has emerged to produce hybrid wafers based upon an SOI structure and characterized by device regions of different crystal orientations. Using such hybrid orientation technology wafers, CMOS circuits can be fabricated with nFETs formed in silicon device regions of a (100) crystal orientation and pFETs formed in silicon device regions of a (110) crystal orientation. Consequently, the performance of the different transistor types in CMOS circuits can be individually optimized.

Junction-type devices are readily implemented in CMOS technologies in HOT wafers. However, devices with vertical junction architectures are incompatible with advances in HOT technology that have downwardly scaled the thickness of the semiconductor layer in which the devices are manufactured. This design deficiency limits the continued implementation of vertical device structures in advanced HOT technologies.

What is needed, therefore, are advanced device structures for a junction field effect transistor fabricated using a hybrid orientation technology wafer, as well as advanced design structures for forming high voltage integrated circuits that include junction field effect transistors.

SUMMARY OF THE INVENTION

In accordance with an embodiment of the invention, a device structure for a junction field effect transistor is provided that is manufactured using a hybrid orientation technology wafer with a first semiconductor layer with a first crystalline orientation, a second semiconductor layer with a second crystalline orientation, and an insulating layer between the first and second semiconductor layers. The device structure includes an epitaxial semiconductor region having the second crystalline orientation and first and second p-n junctions in the epitaxial semiconductor region. The epitaxial semiconductor region extends from the second semiconductor layer through the insulating layer and the first semiconductor layer toward a top surface of the first semiconductor layer. The first and second p-n junctions are arranged in depth within the epitaxial semiconductor region between the second semiconductor layer and the top surface of the first semiconductor layer.

In another embodiment, the device structure for the junction field effect transistor may be included in a design structure embodied in a machine readable medium for designing, manufacturing, or testing an integrated circuit. The design structure may comprise a netlist. The design structure may also reside on storage medium as a data format used for the exchange of layout data of integrated circuits. The design structure may reside in a programmable gate array.

BRIEF DESCRIPTION OF THE DRAWINGS

The accompanying drawings, which are incorporated in and constitute a part of this specification, illustrate embodiments of the invention and, together with a general description of the invention given above and the detailed description of the embodiments given below, serve to explain the principles of the invention.

DETAILED DESCRIPTION

Figure 1A:
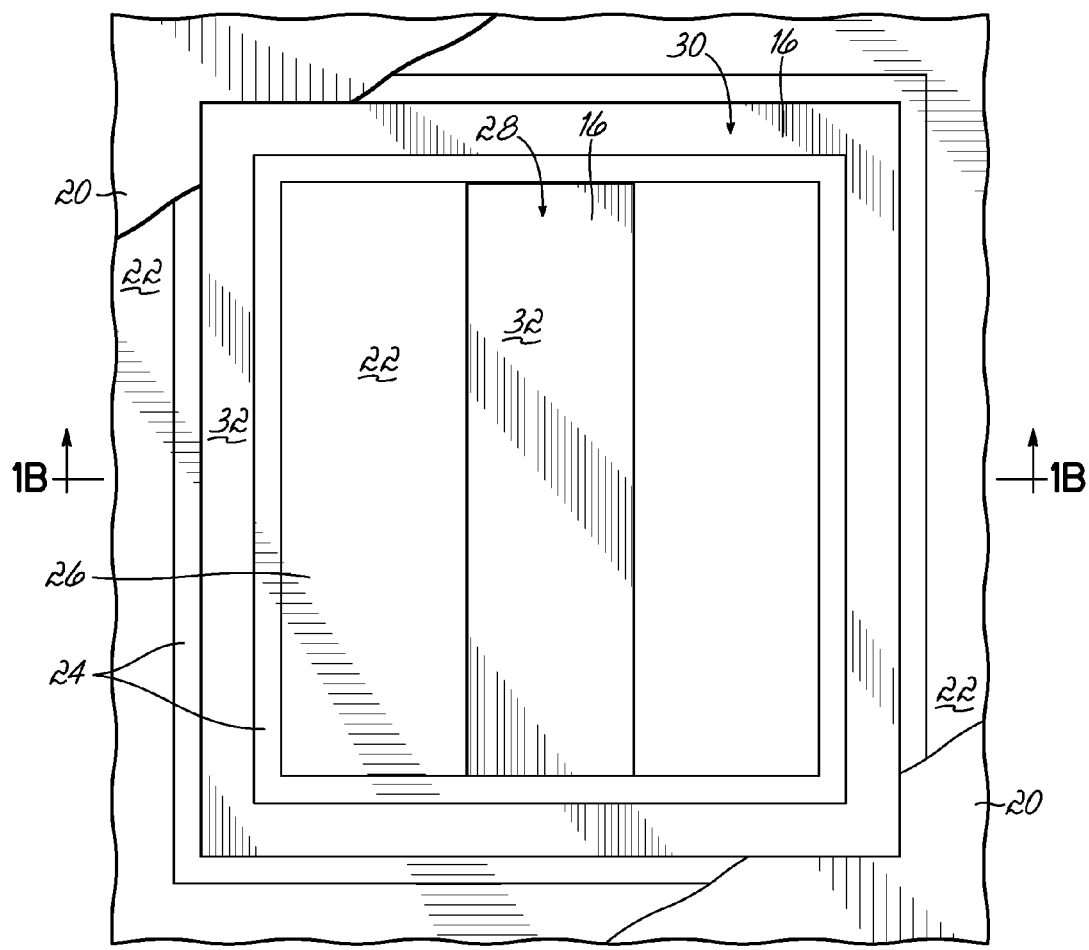
FIG. 1A is a diagrammatic top plan view of a device structure built on a portion of a hybrid orientation technology wafer at an initial fabrication stage of a processing method in accordance with an embodiment of the invention.
Figure 1B:
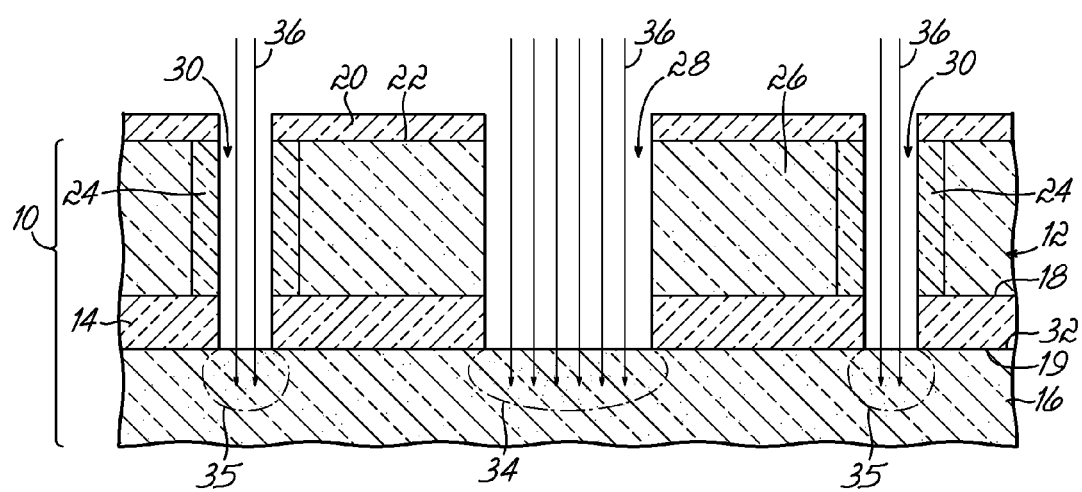
FIG. 1B is a diagrammatic cross-sectional view taken generally along line 1B-1B in FIG. 1A.

With reference to FIGS. 1A, 1B and in accordance with an embodiment of the invention, a hybrid orientation technology (HOT) wafer 10 includes an active device or device layer 12, a buried insulating layer 14 formed of an electrically insulating material, and a bulk substrate 16. The device layer 12 is separated from the bulk substrate 16 by the intervening buried insulating layer 14. The buried insulating layer 14 electrically isolates the bulk substrate 16 from the device layer 12, which is considerably thinner than the bulk substrate 16. The device layer 12 is in direct contact with a top surface 18 of the buried insulating layer 14 and the bulk substrate 16 is in direct contact with a bottom surface 19 of the buried insulating layer 14 so that the device layer 12 and the bulk substrate 16 have a non-contacting relationship.

The device layer 12 is composed of single crystal or monocrystalline semiconductor material, such as silicon or a material that primarily contains silicon. The monocrystalline semiconductor material of the device layer 12 may contain a measurable defect concentration and still be considered single crystal. The buried insulating layer 14 may be a buried oxide layer composed of silicon dioxide (e.g., $SiO_2$). The bulk substrate 16 may also be constituted by a single crystal or monocrystalline semiconductor material, such as silicon, that is lightly doped to have a first conductivity type. For example, the semiconductor material of the bulk substrate 16 may be lightly p-type doped. The HOT wafer 10 is fabricated by a hybrid orientation technology methodology as understood by a person having ordinary skill in the art such that the device layer 12 has one crystalline orientation (e.g., a <100> orientation) and the bulk substrate 16 has a different crystalline orientation (e.g., a <110> orientation).

A hardmask 20 is formed on a top surface 22 of the device layer 12. The hardmask 20 is composed of a material that etches selectively to the semiconductor material constituting the device layer 12 and that functions as a polish stop layer and reactive ion etch mask, as well as an ion implantation mask, during subsequent fabrication stages. In one embodiment, the hardmask 20 may be $SiO_2$ deposited on the top surface 22 by a thermal chemical vapor deposition (CVD) process.

An isolation region 24 is formed in the device layer 12 and bounds a device region 26 of the device layer 12. Isolation region 24 may be formed by, for example, a shallow trench isolation (STI) technique that, as understood by a person having ordinary skill in the art, relies on a conventional lithography and dry etching process to define trenches and then relies on a deposition/planarization process to fill the trenches with dielectric material. The isolation region 24 extends through the device layer 12 to the top surface 18 of the buried insulating layer 14.

A window or opening 28 is formed in the device region 26 by conventional lithography and dry etching processes. Sidewalls of the opening 28 extend vertically (i.e., normal to the plane of the top surface 22) through the device layer 12 and the buried insulating layer 14 to the bulk substrate 16. During the process forming opening 28, an annular window or opening 30 is also defined in the isolation region 24 with sidewalls that extend vertically toward the bulk substrate 16 and intersect the bulk substrate 16. The lithography process entails applying a resist (not shown) on hardmask 20, exposing the resist through a photomask to a pattern of radiation effective to create a latent pattern in the resist for the openings 28, 30, and developing the transferred pattern in the exposed resist. The pattern is transferred from the resist to the hardmask 20 by an anisotropic dry etch, such as reactive-ion etching (RIE) or a plasma etching process, that patterns the openings 28, 30 in the hardmask 20 using the patterned resist as an etch mask. After the openings 28, 30 are formed in the hardmask 20, etching is paused and residual resist is stripped by, for example, plasma ashing or a chemical stripper.

Using the patterned hardmask 20 as an etch mask, an anisotropic dry etching process is used to extend the opening 30 through the isolation region 24 and buried insulating layer 14 to the bulk substrate 16 and to extend the opening 28 through the device layer 12 and the buried insulating layer 14 to the bulk substrate 16. The etching process may be conducted in a single etching step or multiple etching steps with different etch chemistries, including a standard silicon RIE process for the device layer 12. The etching process for the dielectric material in the isolation region 24 and the buried insulating layer 14 stops on a top surface 32 of the bulk substrate 16. The patterned hardmask 20 may be the hardmask that is normally used during HOT processes to access the bulk substrate 16 for growing device regions of different crystal orientation than the device regions supplied by device layer 12.

The openings 28, 30 provide access to the semiconductor material of the bulk substrate 16 for an ion implantation process that implants energetic ions 36 to form shallow doped regions 34, 35 in the semiconductor material of the bulk substrate 16. The semiconductor material of the doped regions 34, 35 is characterized by a conductivity type that is opposite to the conductivity type of the semiconductor material constituting the bulk substrate 16. For example, the semiconductor material of the doped regions 34, 35 may have n-type conductivity. Suitable n-type dopants in silicon are Group V dopants that include, but are not limited to, arsenic, phosphorus, and antimony. The dose of ions 36 is selected to dope the semiconductor material constituting the doped regions 34, 35 at an appropriate dopant concentration selected for the device design. The kinetic energy of the ions 36 and the thickness of the hardmask 20 are selected such that the ions 36 do not penetrate completely through the hardmask 20 to reach the covered portions of the device layer 12.

The semiconductor material of the device layer 12 and the bulk substrate 16 are treated with a re-oxidation and anneal process to heal the implantation damage and to clean the exposed surface. To that end, a thin layer (not shown) of a high temperature oxide is grown on these exposed surfaces. The elevated temperatures during the oxidation process anneal the implantation damage and, furthermore, redistribute the dopant from the doped regions 34, 35 by vertical and lateral diffusion to define a moderately doped region 38, which is visible in FIG. 2B. In particular, the doped region 38 serves as the buried lower gate electrode of the JFET device structure 60, as subsequently described. The oxide is removed by, for example, a wet chemical etch capable of removing oxide selectively to the semiconductor material of the device layer 12 and the bulk substrate 16. The semiconductor material at the re-exposed surfaces of the device layer 12 and the bulk substrate 16 is cleaned using, for example, a dilute hydrofluoric acid dip.

Figure 2A:
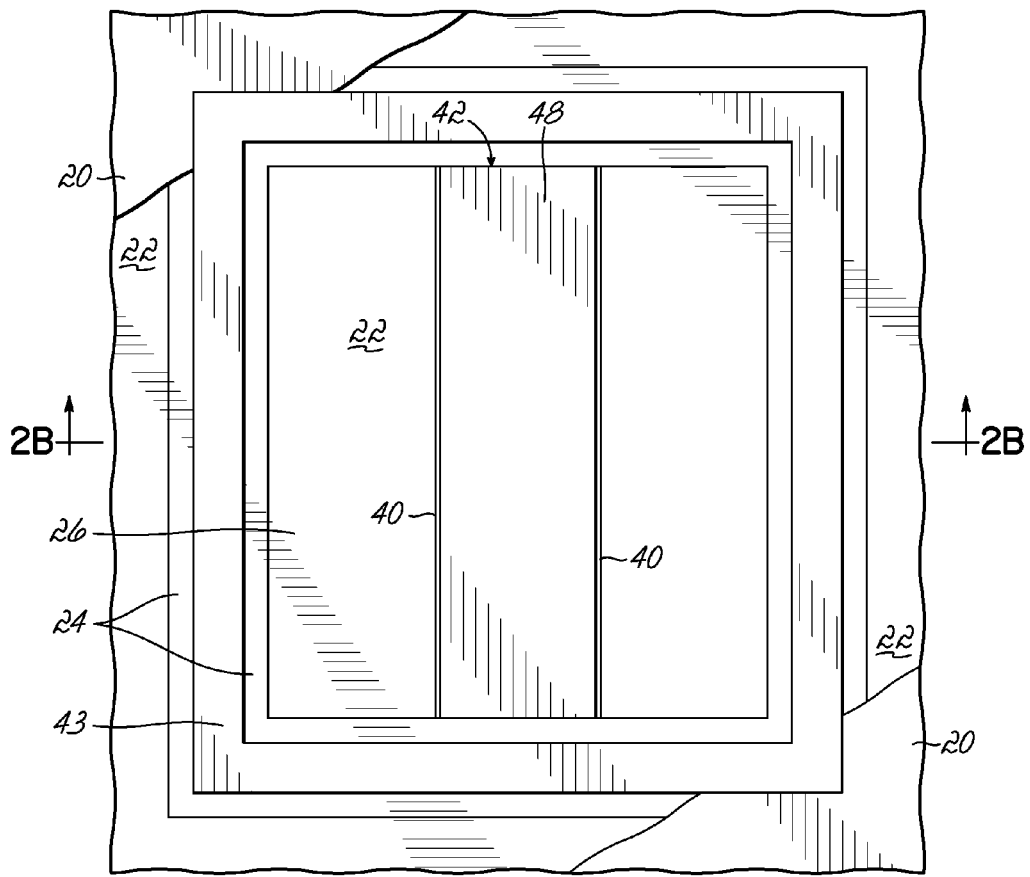
FIG. 2A is a diagrammatic top plan view of the device structure of FIG. 1A at a subsequent fabrication stage.
Figure 2B:
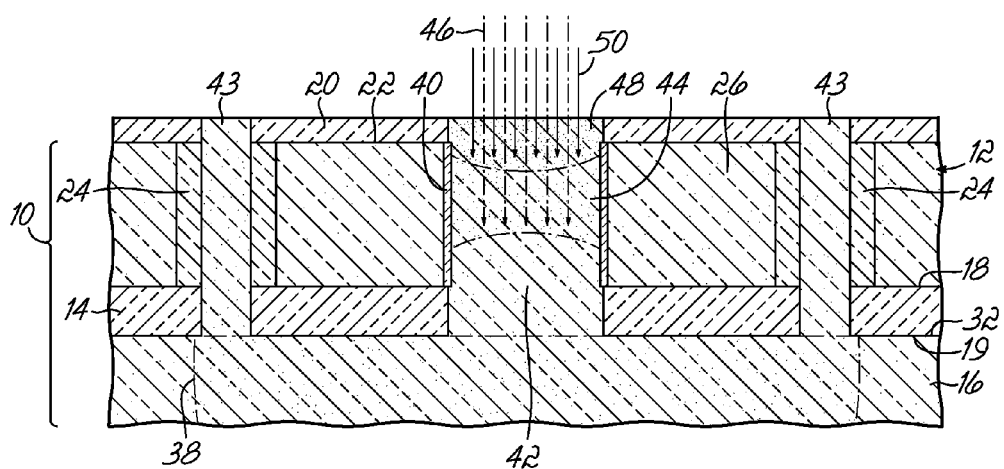
FIG. 2B is a diagrammatic cross-sectional view taken generally along line 2B-2B in FIG. 2A.

With reference to FIGS. 2A, 2B in which like reference numerals refer to like features in FIGS. 1A, 1B and at a subsequent fabrication stage, the opening 28 is lined with a liner 40 of, for example, $SiO_2$ and the openings 28, 30 are filled with regions 42, 43 of semiconductor material. The semiconductor regions 42, 43, which are columnar, may be composed of silicon formed by a selective epitaxial growth (SEG) process. The monocrystalline semiconductor material of the bulk substrate 16 operates as a seed crystal or crystalline seed that establishes a crystallographic pattern for the deposited semiconductor material in openings 28, 30 in which this crystallographic pattern is reproduced. For example, the deposited semiconductor material in the semiconductor regions 42, 43 has a <110> crystallographic orientation if the bulk substrate 16 has a <110> crystallographic orientation. The semiconductor regions 42, 43 may be doped in situ during epitaxial growth to have the same conductivity type as the doped region 38.

The hardmask 20 and liner 40 isolate the semiconductor material in regions 42, 43 from contact with the semiconductor material of the device layer 12 during deposition. As a result, the deposited semiconductor does not nucleate from the trench sidewalls of opening 28 such that the resulting crystal orientation of the deposited semiconductor material is not influenced by the different crystal orientation characterizing the device layer 12. The semiconductor regions 42, 43 are polished flat and planarized by a chemical-mechanical polishing (CMP) process or any other suitable planarization technique. Hardmask 20 functions as a polish stop for the planarization process.

A moderately doped region 44 is defined in the semiconductor region 42 by implanting energetic ions 46 of a dopant characterized by a different conductivity type than the doped region 38 (FIGS. 1A, 1B) through the opening 28 in hardmask 20. For example, the semiconductor material in doped region 44 is doped to have p-type conductivity if the semiconductor material in doped region 38 has n-type conductivity. Suitable p-type impurities are Group III dopants that include, but are not limited to, boron or indium. The dose of ions 46 is selected to dope the semiconductor material constituting the semiconductor region 42 at an appropriate dopant concentration selected for the device design. The ion kinetic energy is selected such that the ions 46 stop within the semiconductor region 42 at a depth between the top surface 22 of the device layer 12 and the top surface 18 of the buried insulating layer 14. The thickness of hardmask 20 is selected based upon the chosen ion kinetic energy and implanted dopant such that the portion of the device layer 12 adjacent to the semiconductor region 42 and bounded by the isolation region 24 does not receive a dose of ions 46. An additional implantation mask (not shown) is formed to cover the semiconductor region 43.

A heavily doped region 48 is defined in the semiconductor region 42 by implanting energetic ions 50 through the opening 28 in hardmask 20. Through selection of the dopant, the semiconductor material in doped region 48 has an opposite conductivity type than the semiconductor material of the doped region 44. For example, if the semiconductor material in doped region 44 has p-type conductivity, then the semiconductor material in doped region 48 has n-type conductivity. The dose of ions 50 is selected to dope the semiconductor material constituting the semiconductor region 42 at an appropriate dopant concentration selected for the device design. The ion kinetic energy is selected such that the ions 50 stop within the semiconductor region 42 at a depth between the top surface 22 of the device layer 12 and the doped region 44. The thickness of hardmask 20 is selected based upon the chosen ion kinetic energy and implanted dopant such that the portion of the device layer 12 adjacent to the semiconductor region 42 and bounded by the isolation region 24 does not receive a dose of ions 50.

A high temperature anneal may be performed to remove the lattice damage induced by the implanted ions 46, 50 and to activate the dopants in the semiconductor material of doped regions 44, 48. Dopant may diffuse vertically from the doped region 38 into the semiconductor region 42, which may also be doped during epitaxial growth with the same dopant as the doped region 38.

The doped regions 44, 48 of opposite conductivity type respectively function as a channel region and an upper gate electrode of the JFET device structure 60. Region 44 may be formed by the CMOS source/drain implantation process used to fabricate low-voltage p-channel MOSFETs (not shown) on other surface areas of the HOT wafer 10. Similarly, region 48 may be formed by the CMOS source/drain implantation process used to fabricate low-voltage n-channel MOSFETs (not shown) on other surface areas of the HOT wafer 10.

Figure 3A:
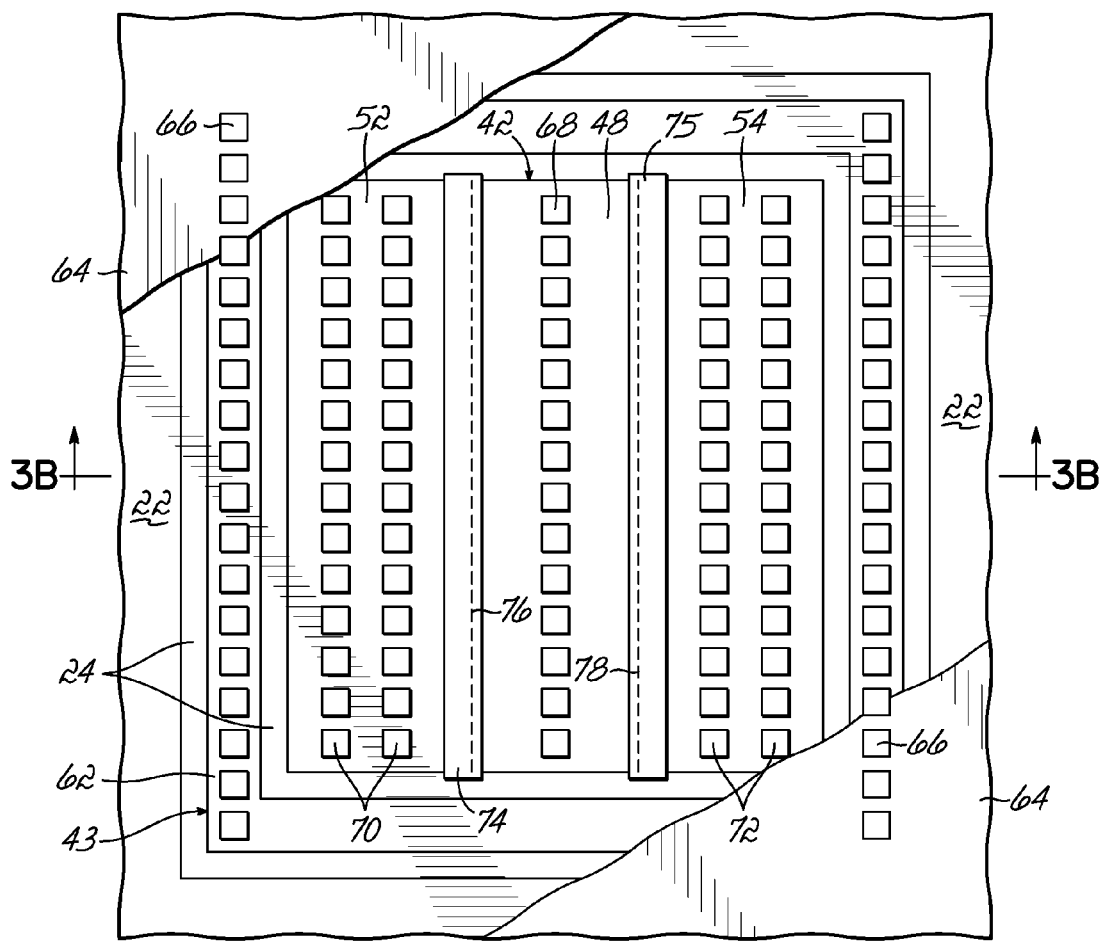
FIG. 3A is a diagrammatic top plan view of the device structure of FIG. 2A at a subsequent fabrication stage.
Figure 3B:
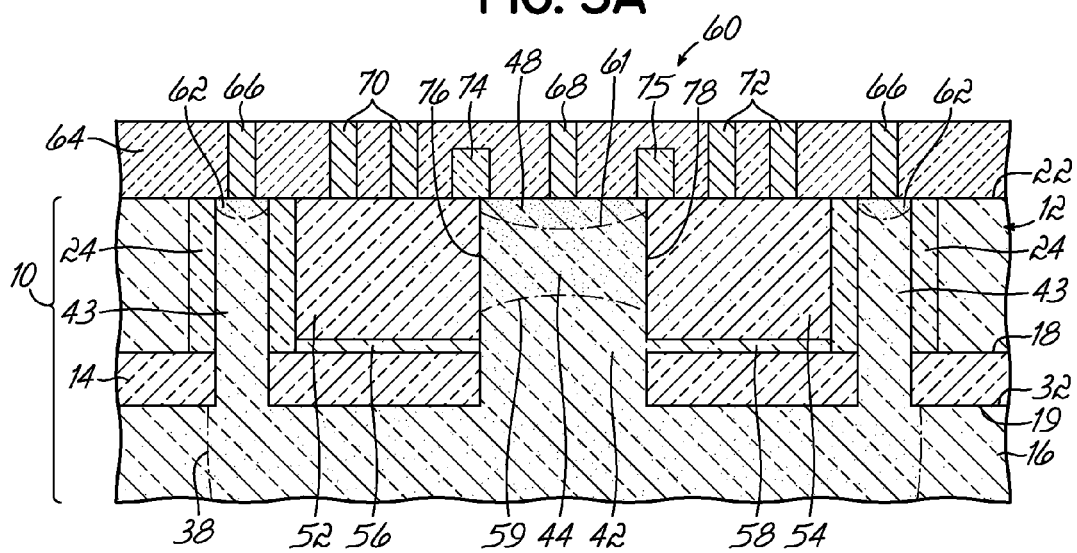
FIG. 3B is a diagrammatic cross-sectional view taken generally along line 3B-3B in FIG. 3A.

With reference to FIGS. 3A, 3B in which like reference numerals refer to like features in FIGS. 2A, 2B and at a subsequent fabrication stage, the hardmask 20 (FIGS. 2A, 2B) is removed from the top surface 22 by, for example, a wet chemical etching process and embedded epitaxial source/drain regions 52, 54 are formed adjacent to the semiconductor region 42. The embedded epitaxial source/drain regions 52, 54, which flank the doped region 44, are composed of a semiconductor material characterized by a different lattice constant than the epitaxial semiconductor material in semiconductor region 42, which imparts compressive stress on the doped region 44 that defines the channel region of the device structure 60. For example, the semiconductor material in the embedded epitaxial source/drain regions 52, 54 may be composed of a silicon germanium alloy (SiGe) containing up to about 35 atomic percent (at. %) germanium that is epitaxially grown in cavities etched in the device layer 12 adjacent to the semiconductor region 42. The embedded epitaxial source/drain regions 52, 54 may be particularly beneficial if the semiconductor material in the channel region defined by the doped region 44 has p-type conductivity.

The embedded epitaxial source/drain regions 52, 54 are formed in cavities that are defined by a conventional photolithography and etching process in the device layer 12 in a flanking relationship with the semiconductor region 42. The etching process also removes the liner 40 (FIGS. 2A, 2B). To promote the epitaxial growth of the embedded epitaxial source/drain regions 52, 54 with the same crystalline orientation as the device layer 12, the depth of the etched cavities is controlled so that the cavities do not extend to the buried insulating layer 14. Thin residual layers 56, 58 of the device layer 12 remain in the cavities and serve as growth seeds or crystalline seeds for initiating the epitaxial growth of the embedded epitaxial source/drain regions 52, 54. The constituent semiconductor material contained in the embedded epitaxial source/drain regions 52, 54 is heavily doped with a dopant to impart the same conductivity type to the constituent semiconductor material as the semiconductor material in doped region 44. The embedded epitaxial source/drain regions 52, 54 may be doped in situ during epitaxial growth to have the same conductivity type as the doped region 44.

The resultant lateral junction field effect transistor (JFET) device structure 60 includes the lower gate electrode defined by the doped region 38, the channel region defined by the doped region 44, and the upper gate electrode defined by the doped region 48, as well as the embedded epitaxial source/drain regions 52, 54 that laterally flank the channel region. The channel region has an opposite conductivity type than the upper and lower gate electrodes to define a p-channel JFET device structure 60. Alternatively, if the conductivity types of the semiconductor material in regions 38, 44, 48 are reversed by altering the fabrication process, an n-channel JFET device structure 60 results. Respective p-n junctions 59, 61 are defined at the conductivity type transitions between the semiconductor materials of doped region 38 and doped region 44, which have opposite conductivity types, and between doped region 44 and doped region 48, which also have opposite conductivity types.

The embedded epitaxial source/drain regions 52, 54 function to optimize the device on-resistance of the JFET device structure 60. The on-resistance per unit area is recognized by a person having ordinary skill in the art as a figure of merit for a high voltage power device.

During the fabrication process, the device structure 60 is replicated across at least a portion of the surface area of the device layer 12 of the HOT wafer 10. A shallow annular heavily doped region 62 is formed in the semiconductor portion 43. The doped region 62 may be formed by applying an implantation mask and implanting a dopant species having the same conductivity type as the dopant introduced into doped region 38. A dielectric layer 64 is deposited and gate contacts 66, 68 are fabricated in the dielectric layer 64 to establish respective electrical connections with the doped region 38 and with the doped region 48, which operate as gate electrodes in the device structure 60. Additional contacts 70, 72 are fabricated in the dielectric layer 64 to establish electrical connections with the embedded epitaxial source/drain regions 52, 54.

Spacers 74, 75 are formed that overlie respective boundaries 76, 78 between the semiconductor region 42 and each of the embedded epitaxial source/drain regions 52, 54. The spacers 74, 75 may be formed by depositing a dielectric material, such as silicon nitride ($Si_3N_4$), applying a patterned mask, and etching with, for example, a RIE process. The spacers 74, 75 participate in electrically isolating the gate contact 68 for the doped region 48 from the contacts 70, 72 for the embedded epitaxial source/drain regions 52, 54. Spacers 74, 75 also space the doped region 48 from the source/drain regions 52, 54, when the source/drain regions 52, 54 are not in situ doped or additionally implanted, which increases the breakdown between the doped regions 38, 48 and the source/drain regions 52, 54 and eliminates eventual parasitic Zener diodes. The boundaries 76, 78 also define the transition between semiconductor materials of different crystal orientations.

Standard CMOS processing also transpires for the low-voltage field effect transistors of the integrated circuit fabricated on the HOT wafer 10. The contacts 66, 68, 70, 72 may be formed by the same CMOS that supplies the body contact for the CMOS field effect transistors. After the devices are completed, standard BEOL processing follows that includes formation of interlayer dielectric layers, conductive vias, and metallization for interconnect wiring levels.

Figure 4:
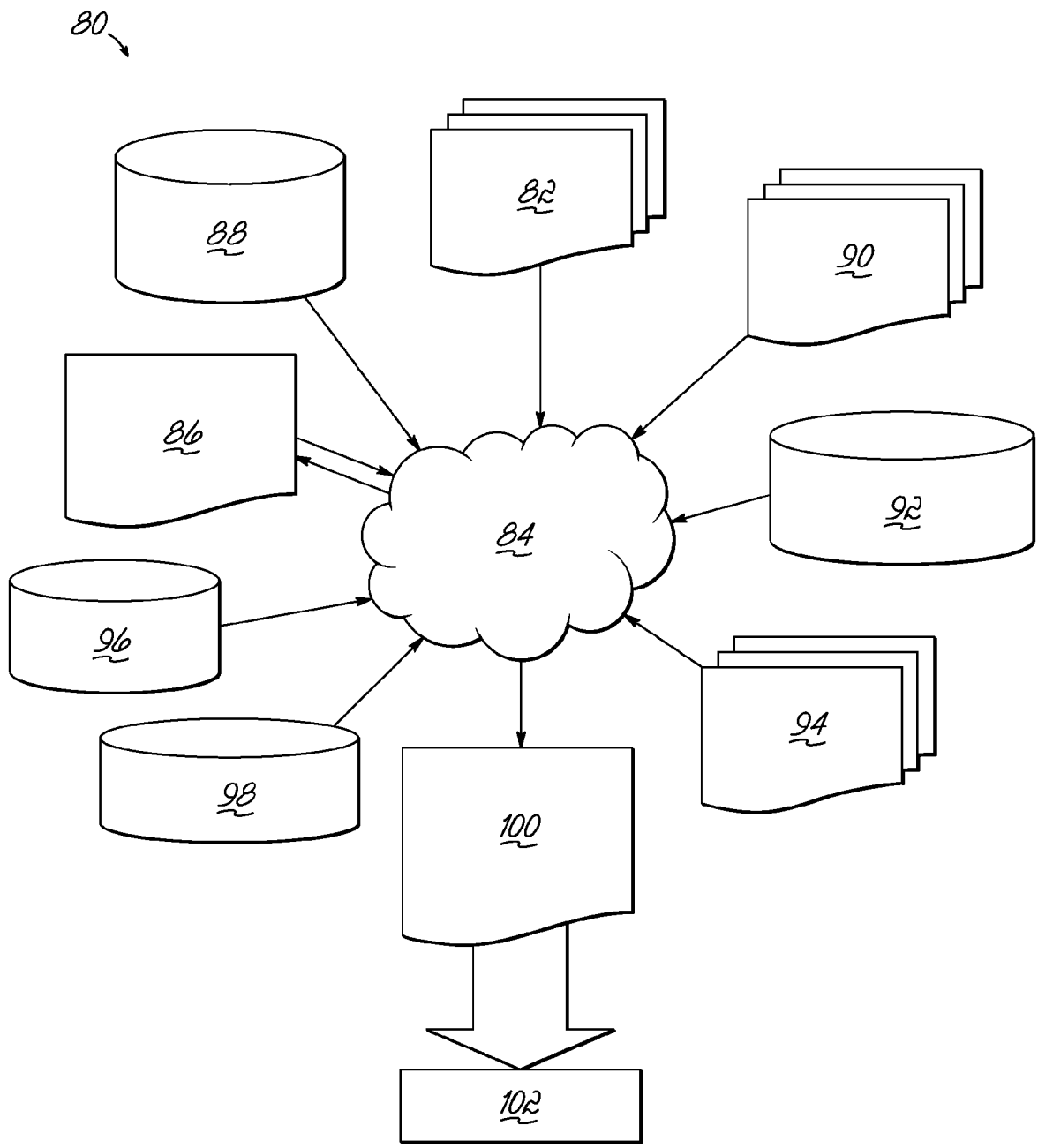
FIG. 4 is a flow diagram of a design process used in semiconductor design, manufacture, and/or test.

FIG. 4 shows a block diagram of an exemplary design flow 80 used for example, in semiconductor design, manufacturing, and/or test. Design flow 80 may vary depending on the type of IC being designed. For example, a design flow 80 for building an application specific IC (ASIC) may differ from a design flow 80 for designing a standard component or from a design flow 80 for instantiating the design into a programmable array, for example a programmable gate array (PGA) or a field programmable gate array (FPGA) offered by Altera® Inc. or Xilinx® Inc. Design structure 82 is preferably an input to a design process 84 and may come from an IP provider, a core developer, or other design company or may be generated by the operator of the design flow, or from other sources. Design structure 82 comprises an embodiment of the invention as shown in FIGS. 3A, 3B in the form of schematics or HDL, a hardware-description language (e.g., Verilog, VHDL, C, etc.). Design structure 82 may be contained on one or more machine readable medium. For example, design structure 82 may be a text file or a graphical representation of an embodiment of the invention as shown in FIGS. 3A, 3B. Design process 84 preferably synthesizes (or translates) an embodiment of the invention as shown in FIGS. 3A, 3B into a netlist 86, where netlist 86 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 86 is resynthesized one or more times depending on design specifications and parameters for the circuit.

Design process 84 may include using a variety of inputs; for example, inputs from library elements 88 which may house a set of commonly used elements, circuits, and devices, including models, layouts, and symbolic representations, for a given manufacturing technology (e.g., different technology nodes, 32 nm, 45 nm, 90 nm, etc.), design specifications 90, characterization data 92, verification data 94, design rules 96, and test data files 98 (which may include test patterns and other testing information). Design process 84 may further include, for example, standard circuit design processes such as timing analysis, verification, design rule checking, place and route operations, etc. One of ordinary skill in the art of integrated circuit design can appreciate the extent of possible electronic design automation tools and applications used in design process 84 without deviating from the scope and spirit of the invention. The design structure of the invention is not limited to any specific design flow.

Design process 84 preferably translates an embodiment of the invention as shown in FIGS. 3A, 3B, along with any additional integrated circuit design or data (if applicable), into a second design structure 100. Design structure 100 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 100 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 3A, 3B. Design structure 100 may then proceed to a stage 102 where, for example, design structure 100 proceeds to tape-out, is released to manufacturing, is released to a mask house, is sent to another design house, is sent back to the customer, etc.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The term "vertical" refers to a direction perpendicular to the horizontal, as just defined. Terms, such as "on", "above", "below", "side" (as in "sidewall"), "upper", "lower", "over", "beneath", and "under", are defined with respect to the horizontal plane. It is understood that various other frames of reference may be employed for describing the invention without departing from the spirit and scope of the invention. It is also understood that features of the invention are not necessarily shown to scale in the drawings. Furthermore, to the extent that the terms "includes", "having", "has", "with", or variants thereof are used in either the detailed description or the claims, such terms are intended to be inclusive in a manner similar to the term "comprising."

It will be understood that when an element as a layer, region or substrate is described as being "on" or "over" another element, it can be directly on or over the other element or intervening elements may also be present. In contrast, when an element is described as being "directly on" or "directly over" another element, there are no intervening elements present. It will also be understood that when an element is described as being "connected" or "coupled" to another element, it can be directly connected or coupled to the other element or intervening elements may be present. In contrast, when an element is described as being "directly connected" or "directly coupled" to another element, there are no intervening elements present.

The fabrication of the semiconductor structure herein has been described by a specific order of fabrication stages and steps. However, it is understood that the order may differ from that described. For example, the order of two or more fabrication steps may be swapped relative to the order shown. Moreover, two or more fabrication steps may be conducted either concurrently or with partial concurrence. In addition, various fabrication steps may be omitted and other fabrication steps may be added. It is understood that all such variations are within the scope of the present invention. It is also understood that features of the present invention are not necessarily shown to scale in the drawings.

While the invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A device structure for a junction field effect transistor manufactured using a semiconductor-on-insulator wafer with a first semiconductor layer with a first crystalline orientation, a second semiconductor layer with a second crystalline orientation, and an insulating layer between the first and second semiconductor layers, the device structure comprising:
    an epitaxial semiconductor region having the second crystalline orientation, the epitaxial semiconductor region extending from the second semiconductor layer through the insulating layer and the first semiconductor layer toward a top surface of the first semiconductor layer; and
    first and second p-n junctions in the epitaxial semiconductor region, the first and second p-n junctions are arranged in depth within the epitaxial semiconductor region between the second semiconductor layer and the top surface of the first semiconductor layer.

2. The device structure of claim 1 further comprising:
    a channel region defined in the epitaxial semiconductor region between the first and second p-n junctions; and
    first and second embedded epitaxial source/drain regions in the first semiconductor layer that laterally flank the channel region, the first and second embedded epitaxial source/drain regions configured to apply stress to the channel region.

3. The device structure of claim 2 wherein the first and second embedded epitaxial source/drain regions are composed of a semiconductor material having a different lattice constant than the epitaxial semiconductor region.

4. The device structure of claim 3 wherein the first and second embedded epitaxial source/drain regions have the first crystalline orientation, and further comprising:
    first and second portions of the first semiconductor layer between the first and second embedded epitaxial source/drain regions and the insulating layer, the first and second portions of the first semiconductor layer operating as respective crystalline seeds with the first crystalline orientation.

5. The device structure of claim 2 wherein the channel region has a p-type conductivity.

6. The device structure of claim 1 further comprising:
    a first doped region of a first conductivity type in the epitaxial semiconductor region;
    a second doped region of a second conductivity type in the epitaxial semiconductor region at a shallower depth than the first doped region, the first p-n junction defined at a first transition between the first conductivity type in the first doped region and the second conductivity type in the second doped region; and
    a third doped region of the first conductivity type in the epitaxial semiconductor region at a shallower depth than the second doped region, the second p-n junction defined at a second transition between the first conductivity type in the third doped region and the second conductivity type in the second doped region.

7. The device structure of claim 6 wherein the first conductivity type is n-type and the second conductivity type is p-type.

8. A design structure embodied in a machine readable medium for designing, manufacturing, or testing an integrated circuit, the design structure comprising:
    a semiconductor-on-insulator wafer having a first semiconductor layer with a first crystalline orientation, a second semiconductor layer with a second crystalline orientation, and an insulating layer between the first and second semiconductor layers; and
    a junction field effect transistor including an epitaxial semiconductor region having the second crystalline orientation and first and second p-n junctions in the epitaxial semiconductor region, the epitaxial semiconductor region extending from the second semiconductor layer through the insulating layer and the first semiconductor layer toward a top surface of the first semiconductor layer, and the first and second p-n junctions are arranged in depth within the epitaxial semiconductor region between the second semiconductor layer and the top surface of the first semiconductor layer.

9. The design structure of claim 8 wherein the design structure comprises a netlist.

10. The design structure of claim 8 wherein the design structure resides on storage medium as a data format used for the exchange of layout data of integrated circuits.

11. The design structure of claim 8 wherein the design structure resides in a programmable gate array.

* * * * *